United States Patent [19]

Otten

[11] 4,084,153
[45] Apr. 11, 1978

[54] APPARATUS FOR RECONSTRUCTING A BINARY BIT PATTERN

[75] Inventor: Thomas H. Otten, Indian Harbour Beach, Fla.

[73] Assignee: Harris Corporation, Cleveland, Ohio

[21] Appl. No.: 666,700

[22] Filed: Mar. 15, 1976

[51] Int. Cl.[2] .............................................. G11C 13/00
[52] U.S. Cl. ..................................... 365/125; 350/3.79
[58] Field of Search ............... 350/3.5, 162 F; 356/71; 340/173 LT, 173 LM, 174 YC; 353/27 R, 27 A

[56] References Cited

U.S. PATENT DOCUMENTS

| | | | |
|---|---|---|---|
| 3,188,907 | 6/1965 | Trampel et al. | 340/173 LM |
| 3,720,923 | 3/1973 | Chen et al. | 340/173 LM |
| 3,735,374 | 5/1973 | Rembaut | 350/3.5 X |
| 3,781,830 | 12/1973 | Vilkomerson | 340/173 LM |
| 3,800,078 | 3/1974 | Cochran et al. | 340/146.3 AG X |
| 3,872,434 | 3/1975 | Durall et al. | 340/146.3 AG |
| 3,959,784 | 5/1976 | Meier | 340/173 LT X |
| 3,962,681 | 6/1976 | Requa et al. | 340/146.3 AG X |

*Primary Examiner*—Thomas J. Sloyan

[57] ABSTRACT

A binary bit pattern is reconstructed from a block of analog signals corresponding to the number of known bit positions of the pattern being reconstructed. The analog signals, which may take the form of light intensity signals, vary in signal level with the binary level represented as well as with a characteristic which causes the signal levels of the analog signals to vary in a known manner as a function of bit position. In reconstructing the bit pattern, an output signal is developed having a value dependent upon that of at least one of the analog signals which has a known bit level reconstruction. This signal is used for providing a variable threshold having a value which varies in dependence upon the outut signal as modified by a modifying factor which varies in the known manner as a function of bit position. Bit decision circuitry includes a comparator for sequentially comparing the analog signals with the variable threshold to provide bit decision indications.

12 Claims, 11 Drawing Figures

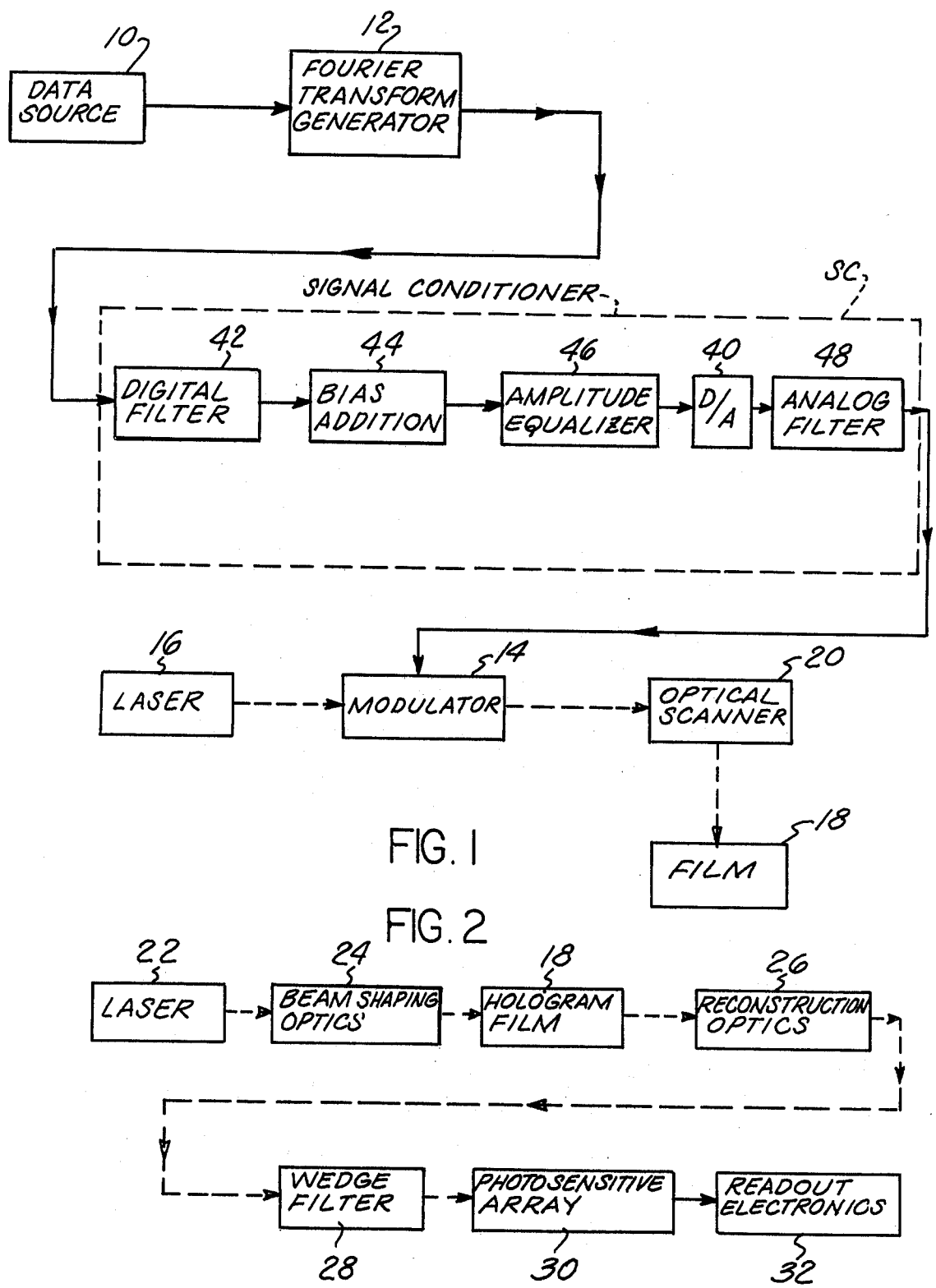

APPARATUS FOR RECONSTRUCTING A BINARY BIT PATTERN

This invention relates to the art of reconstructing a binary bit pattern from a block of analog signals, and more particularly to reconstructing such a bit pattern where the analog signals vary in magnitude with both the binary level representation as well as with the bit position.

The invention is particularly applicable in conjunction with reconstructing a binary bit pattern which is stored in the form of a Fourier transform hologram and will be described in conjunction with such an application; although, it is to be appreciated that the invention may be employed in various applications requiring reconstruction of a binary bit pattern from a block of analog signals.

It is known that recording of digital data may be had through the use of Fourier transform holograms. A Fourier transform hologram may be generated synthetically or interferometrically. In interferometric holography a spatially modulated beam of coherent light, called the signal beam, is mixed at the film surface with an unmodulated beam of light, called the reference beam. The interference pattern thus generated on the film surface is a hologram. Synthetic holography differs in that only a single beam of intensity light is scanned across the film to create the hologram. Modulation is controlled electronically so that the proper pattern is exposed on the film surface.

Each bit of the data of the original data block may be represented by a unique spatial frequency on the film. Thus, each bit of the original data is represented on the film by the presence or absence of a particular spatial frequency. During readout, the halogram may be illuminated with a light beam which is perpendicular to the hologram plane or may be illuminated by an off axis beam. The beam then passes through conventional reconstruction optics and spatial filtering before illuminating an array of photosensitive detectors. The reconstruction optics performs an inverse Fourier transformation of the light diffracted by the hologram in order to produce the original byte of data in the form of an optical intensity pattern which may then be distributed on an array of photosensitive detectors to convert the optical intensity pattern into an electrical data signal.

In the reconstruction of the binary bit pattern, the number of photodetectors may correspond with the number of bit positions of the block of binary data being reconstructed. If one detector is utilized for each binary bit, then the data reconstruction may provide a binary "1" for a detector output and a binary "0" for the absence of an output. However, it has been found with such holograms that the light intensity as seen by the respective detectors varies nonlinearly with the magnitude decreasing with spatial positioning of the detectors from the optical axis of the readout beam. This distribution of energy levels results from variation in bit reconstruction due to noise, film processor variations, laser power level changes between calibration intervals, variations in the modulation transfer function as a function of spot size changes, and recorder focus offset. Since a decision must be made as to whether each photodetector signal level is representative of a binary "1" or a binary "0" data bit, it is apparent that a fixed threshold for comparison cannot be employed. Moreover, a hologram exhibits a variable intensity level, similar to a bell-shaped curve, over the area that it is recorded on the film and this causes variations in the light intensities impinging on the array of photodetectors. Consequently, it is desirable to make several scans of a hologram and determine which scan provided the strongest overall intensity level and chose that scan or one nearby to represent the block of data being reconstructed.

It is therefore an object of the present invention to provide bit reconstruction for a hologram readout employing a variable threshold in making bit decisions.

It is a still further object of the present invention to recalculate the variable threshold to be used for each scan when a plurality of scans of the hologram are made in a bit reconstruction process.

It is a still further object of the present invention to make repeated scans of a hologram and make a scan decision based on the scan having the greatest intensity level.

The present invention contemplates reconstruction of a binary bit pattern of a known number of bit positions from a block of analog signals, such as those obtained from a plurality of photodetectors which receive a pattern of light intensities, with the number and location of the analog signals corresponding to the bit positions of the bit pattern to be reconstructed. Moreover, it is contemplated that the analog signals vary in signal level with both the binary level of the data bit being represented and with the bit position of the data bit being represented. This variation is a characteristic that causes the signal levels of the analog signals to vary in a known manner as a function of bit position. It is further contemplated that at least one of the analog signals has a known binary level bit reconstruction.

In accordance with the present invention, an output signal is provided having a value dependent upon the value of at least one analog signal that has a known binary level bit reconstruction. A variable threshold is provided having a value which varies in dependence upon the output signal as modified by a modifying factor which varies in a known manner as a function of bit position. Bit decisions are sequentially made by comparing the analog signals with the variable threshold and providing a bit decision indication for each of the bit positions dependent upon the respective comparisons.

In accordance with another aspect of the present invention, each analog signal varies in magnitude from a low level to a peak level and then back toward the low level as a function of time and circuitry is provided to make several scans of all of these analog signals and select one scan to represent the binary bit pattern based on the relative signal levels of the various scans.

DESCRIPTION OF THE DRAWINGS

The foregoing and other objects and advantages of the invention will become more readily apparent from the following description of the preferred embodiment of the invention, as taken in conjunction with the accompanying drawings which are a part hereof and wherein:

FIG. 1 is a block diagram illustration of a synthetic hologram system to which the present invention may be applied;

FIG. 2 is a block diagram illustration of a readout system for reconstructing the information contained in a synthetic hologram and employing the readout electronics of the present invention;

DESCRIPTION OF THE PREFERRED EMBODIMENT

GENERAL DESCRIPTION

Figure 3:
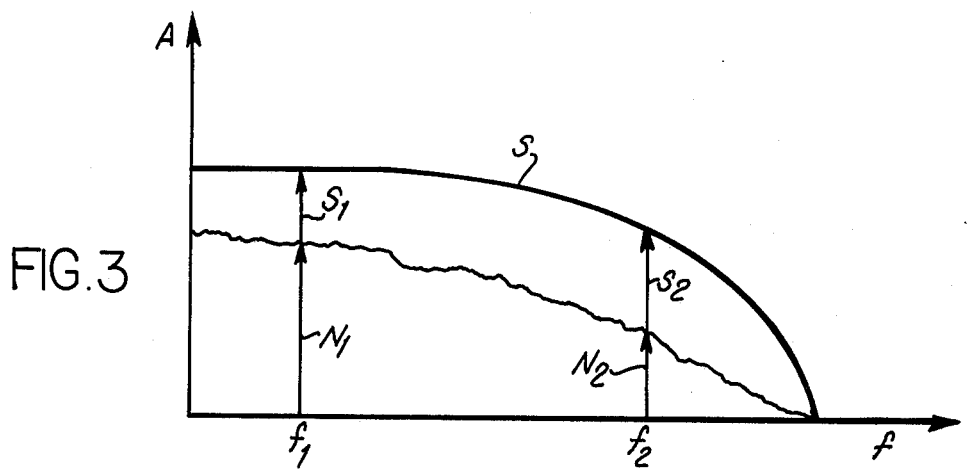
FIG. 3 is a graphical illustration showing signal to noise ratio roll-off with spatial frequency.

Reference is now made to the drawings wherein the showings are made for the purposes of illustrating a preferred embodiment of the invention only and not for purposes of limiting same. The readout electronics of the present invention may be employed in various applications requiring reconstruction of a bit pattern from a block of analog signals. One such application is that as illustrated in FIGS. 1-6. In this application, the analog signals may be considered as a spatially distributed light intensity pattern impinging on a linear array of photosensitive detectors employed in a hologram readout system. This is the preferred application of the present invention. In order that one may fully understand the present invention, the following general description is given with respect to the synthetic hologram recording and readout system as illustrated in FIGS. 1-6 and this will be followed by a description of the preferred embodiment of the readout electronics as illustrated in FIGS. 7-10.

Referring now to FIG. 1, there is illustrated a synthetic hologram recording system wherein a byte of binary data is supplied by a suitable data source 10 to a Fourier transform generator 12 which provides a transform of the byte of digital data and this transform, which takes the form of digital samples or coefficients of a discrete Fourier series transform, is supplied to a signal conditioning circuit SC and which, in turn, supplies a time varying modulating signal, representative of the Fourier series transform, to a modulator 14. The modulator 14 responds to the control signal provided by the signal conditioner circuit SC to intensity modulate a beam of coherent light obtained from a laser source 16 as the beam is scanned across a photosensitive recording film 18 by means of a suitable optical scanner such as an acousto-optic scanner or a mechanical scanner such as scanner 20. Thus, a synthetic hologram of the byte of binary data is recorded on film 18 as opposed to the data itself.

Reference is now made to FIG. 2 which illustrates apparatus for readout and reconstruction of the data recorded as a Fourier transform hologram on film 18. Readout is accomplished by relatively conventional means in that a source of coherent light obtained from a laser source 22, as shaped by suitable beam shaping optics, impinges on film 18. An inverse Fourier transformation is performed optically on the light diffracted by the synthetic hologram by means of conventional reconstruction optics 26. Spatial optical filtering, as by a wedge filter 28, is employed during the readout to provide amplitude compensation of the reconstructed data band so that more nearly equal energy signals are incident upon each element of a photosensitive detector array 30. The electrical output from the photosensitive array 30 is employed to energize suitable readout electronics 32.

The signal conditioning circuit SC includes components which serve to compensate for roll-off in the signal to noise ratio as a function of spatial frequency and components to compensate for nonlinear amplitude variations. The signal conditioner SC processes the discrete Fourier transform sample values obtained from the Fourier transform generator 12 and converts them to an analog signal that is suitable to intensity modulate a laser beam. In the embodiment shown in FIG. 1 the signal conditioner employs a discrete digital filter 42, a bias adder 44, an amplitude equalizer 46, a digital to analog converter 40, and an analog filter 48. The digital filter 42 serves to receive sample coefficients of the Fourier transform function from the Fourier transform generator 12 and shapes the frequency distribution of the hologram function to achieve a uniform signal to noise ratio upon readout at various spatial frequencies which comprise the hologram function. The signal energy is thus distributed on a uniform signal to noise basis before recording and, as will be described hereinafter with reference to FIG. 2, the process is later reversed during readout by making the bit intensity uniform with an optical wedge filter 28 before the light strikes the readout photosensitive detectors 30. The digital filter also tends to compensate for the system transfer function which is a product of various subsystem transfer functions including the following: the transfer function of the signal conditioner SC; the transfer function of the laser modulator 14; the spot intensity of the recording beam; and the film modulation transfer function.

FIG. 3 is a graphical illustration showing the modulation transfer function of a system which does not employ correction, such as digital filter 42, and from this graphical configuration it is seen that both the signal S and the noise N roll-off as a function of spatial frequency. However, the amplitude of the noise rolls off at a faster rate than that of the signal, and, hence, the signal to noise ratio SNR varies with increasing spatial frequency. For example, at frequency $F_1$ the ratio of the signal $S_1$ to noise $N_1$ is substantially less than at a much high frequency $F_2$ where the ratio is $S_2$ to $N_2$. The digital filter 42 serves to tailor or weight the digital samples or coefficients obtained from the Fourier transform generator over the frequency band so that the output information exhibits a substantially constant signal to noise ratio SNR over the data band or spatial frequency band employed.

The bias addition circuit 44 may take a form well known in the art and serves to provide a fixed bias to the digital output signals obtained from the digital filter 42. This is done in the embodiment illustrated because it is contemplated that the Fourier transform generator 12 may provide output coefficients which have both positive and negative values. Consequently then, to prevent the beam modulating function from becoming negative at any time, the output of the digital filter 42 is offset by a fixed bias signal by means of the bias addition circuit 44. During readout the inverse transform of the bias signal is a DC term that contaminates a region near the origin of the data function. The DC bias level added to the modulating signal for film biasing purposes is independent of the particular values of the data being recorded because the DC level of the data is made very small by the addition of random phase terms in the transform generator.

The amplitude equalizer 46 serves to weight the hologram function nonlinearly so as to compensate for system nonlinearities of amplitude that arise in the recording process and in the film amplitude response characteristics. Different types of film used for recording the holograms have different nonlinear exposure characteristics.

Figure 4:
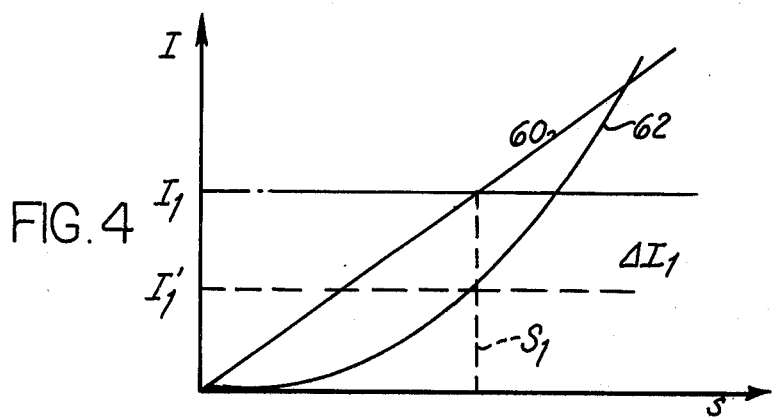
FIG. 4 is a graphical illustration showing amplitude nonlinearity response characteristics.
Figure 5:
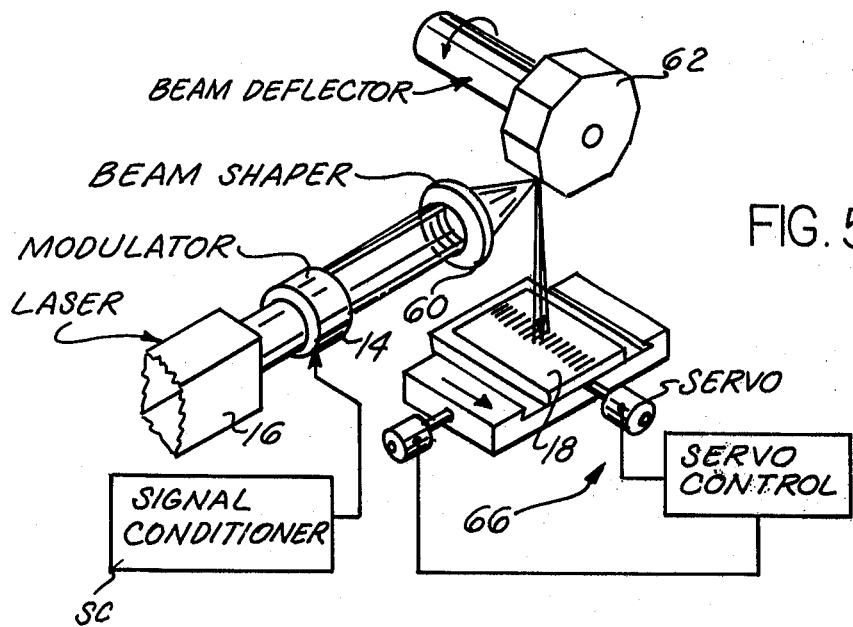
FIG. 5 is a perspective illustration involving optical recording apparatus.

With respect to the amplitude equalizer, reference is now made to the graphical illustration of FIG. 4 illustrating the intensity of the information recorded on the film as a function of the sample being recorded. The desired response characteristic is a linear curve 60. However, the actual response characteristic is represented by the nonlinear curve 62. Consequently then, for a given sample $S_1$, the level of intensity recorded is indicated by $I'_1$ and not the desired level $I_1$. A correction of $\Delta I_1$ is required to obtain the correct intensity recording. As will be explained in greater detail hereinafter, the amplitude equalizer provides a correction for each sample recorded so that with respect to the example of FIG. 4 the intensity recorded will be that corresponding to level $I_1$ and not to level $I_1'$. It is in this manner that the amplitude equalizer weights the hologram function nonlinearly to compensate for system nonlinearities of amplitude.

The corrected sample values from the amplitude equalizer 46 are converted to a time varying analog signal by means of a conventional digital to analog converter 40. These signals are then filtered by an analog filter 48 so as to pass the data band itself but cut off higher frequencies. In the event both a real data band and a data band image are provided, this will serve to cut off the data band image and other higher order blocking images which might exist at frequencies above the desired data band.

The time varying analog signal provided by the signal conditioner circuit SC drives a modulator 14. Reference should now be made to both FIGS. 1 and 5 for the optical recording equipment. A laser beam from laser source 16 enters modulator 14 and is intensity modulated as a function of time by the time varying control signal supplied by the signal conditioner SC. Modulator 14 is conventional and may take the form of either an electro-optical transducer or an acousto-optical type modulator. The output of the modulator 14 is a spatially stationary beam of coherent light that is intensity modulated as a function of time and wherein equal successive increments of time represent successive sample values of the hologram function.

The intensity modulated beam from the modulator 14 is shaped in transverse directions by beam expander lenses 60 which is conventional in the art. After expansion, the intensity modulated signal beam continues along a light path to a scanner 62 from which the beam is reflected in time varying directions in order to distribute the hologram function through space. The scanner is conventional and its function is to scan the time intensity modulated signal beam across the recording film 18 in one sweep during the time the analog signal driving the modulator 14 changes through one hologram function. This scanning action converts a time function of beam intensity to a spatial distribution of beam intensity, transversely distributed with respect to the direction of propagation of the light.

After deflection by the scanner 62, the signal beam is directed onto a transverse plane at which the photographic film 18 is located. A film transport unit 66, which includes a servo control mechanism, moves the film transversely in the film plane, in a direction perpendicular to the transverse direction in which the beam scans.

Each hologram corresponds to one optical scan by the scanner 62 and successive holograms are recorded by moving the film by means of the film transport unit 66. Preferably, the film is moved continuously (rather than in steps) while successive holograms are being recorded by successive optical scans perpendicular to the direction of film travel.

The intensity of light impinging on the film is controlled by one of the hologram function samples. The angular position of the scanner 62 is synchronized with the start of the hologram function that modulates the light beam so that the sample values start at one end of an optical scan.

The data in each hologram is contained in a spatial frequency side band. Each bit of the data of the original data block produces a unique spatial frequency on the film. Thus, each bit of original data is represented on the film by the presence or absence of a particular spatial frequency. The spatial phase of the spatial frequencies comprising the hologram function does not affect the location or intensity of the readout light beam at the photodetector array, and, hence, is of no consequence.

Figure 6:
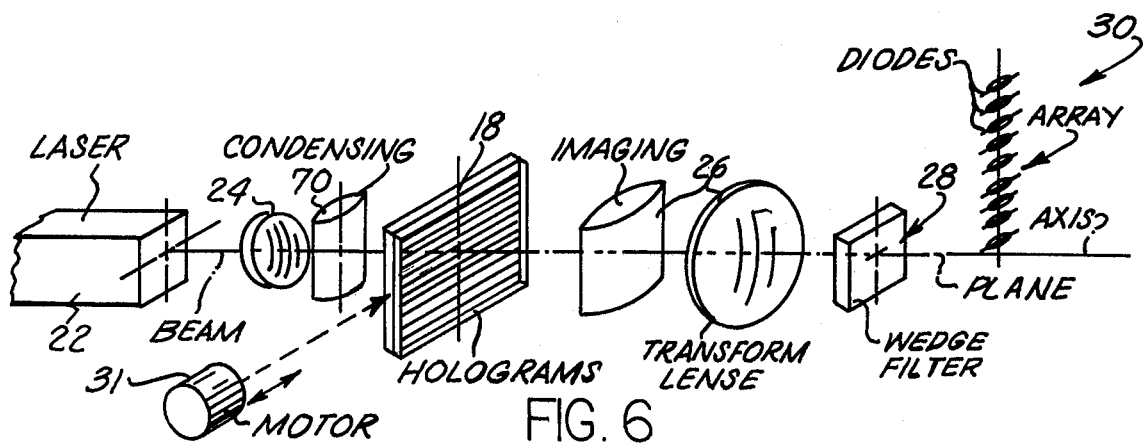
FIG. 6 is a perspective illustration of the optical readout apparatus.

Following the recording of a sequence of holograms, the film is developed and its surface hardened by conventional film processing equipment. The data in the hologram may be readout by equipment as shown with reference to FIGS. 2 and 6. Thus the film 18, containing the recorded hologram function, is positioned so as to be illuminated by a coherent light beam derived from laser source 22. This laser beam is applied through conventional beam shaping optics 24 which may include a condensing lens 70, so that the shape of the beam is such as to illuminate slightly less than all of the recorded hologram in order to leave some margin to prevent illuminating an adjacent hologram area at the same time. It is to be noted that the hologram may be illuminated with a light beam which is perpendicular to the hologram plane, as illustrated in FIG. 6, or may be illuminated by an off axis beam.

After transmission through the beam shaping optics and the hologram recorded on film 18, the beam passes through conventional reconstruction optics 26 and then through a wedge filter 28 before illuminating an array of photosensitive diodes 30. The wedge filter 28 is employed for equalizing the signal energy of each bit in the optical reconstruction incident on the photosensitive detector array. The wedge filter attenuates signal and noise components by the same attenuation ratio, and, hence, does not affect the signal to noise ratio.

The reconstruction optics 26 contains a spherical lens 72 which performs a Fourier transformation on the light beam diffracted by the recorded hologram and focuses the resulting optical bit construction on the photosensitive detector array 30. The Fourier transform of the recorded hologram corresponds to the original data block bit pattern because the transform operation that was performed by the transform generator 12 before recording and the transform operation subsequently performed by lens 72 during readout, are inverse operations.

The photosensitive detectors in the photosensitive array serve to detect the incident optical bit reconstruction light pattern passed by the wedge filter 28 and convert the pattern into an electrical bit stream. The photosensitive array 30 may include a self-scanning type of array which is well known and commercially available from the Reticon Corporation of Mountain View, California. In this circuit the photosensitive array causes the individual photodetectors of the array to be interrogated one at a time as a traveling pulse arrives at them in succession to produce a serial stream of output data. Upon completion of one scan of all of the photosensitive detectors of the array, another scan is started. In this manner, the readout electronics 32 provides an output corresponding with the original data provided by the data source 10.

READOUT ELECTRONICS

In accordance with the present invention, the readout electronics 32 processes the electrical bit stream of output data provided by the photosensitive detectors of the array. In this process, a determination is made as to whether each bit is representative of a binary "1" or binary "0" signal. In the example being given herein, the bit stream for a hologram may include 64 bit positions and, hence, for each scan, 64 bit decisions are made. Each bit decision is made by comparing the magnitude of a bit signal against a threshold. However, the intensity of light impinging on the detectors varies with detector displacement from the optical axis and, hence, a variable threshold is required. The readout electronics 32 includes circuitry that automatically adjusts the threshold level for deciding whether a bit signal is a binary "1" or a binary "0". As the record 18 containing the holograms is transversly displaced through the laser beam by means of motor 31, the array of photodetectors 30 is scanned at a sufficient rate that for each hologram a plurality of scans are made. The scanning rate is on the order of 20 scans per hologram. The readout electronics, as will be described in greater detail hereinafter, determines which scan of a hologram produced the overall signal level of the greatest strength and this information is used to select the scan to represent the block of data being retrieved.

Figure 7:
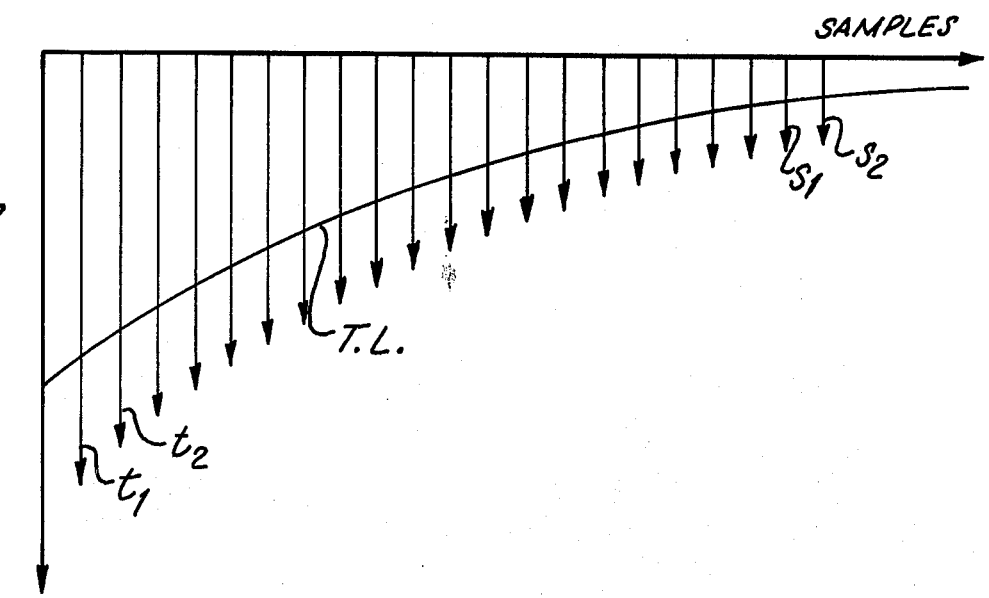
FIG. 7 is a graphical illustration showing the variation of signal level intensities at the photodetectors.

Reference is now made to FIG. 7 which provides a graphical illustration of intensity levels of bits as detected by the array of photodetectors 30. In this example the light intensity, as seen by the respective detectors, varies nonlinearly such that the magnitude decreases with spatial positioning of the detectors from the optical axis. This distribution of energy levels results from variations in bit reconstruction due to noise, film processor variations, laser power level changes between calibration intervals, and variations in the modulation transfer function as the function of spot size changes and recorder focus offset. Since a decision must be made as to whether each signal level is representative of a binary "1" or a binary "0" data bit, it is apparent that a fixed threshold for comparison cannot be employed.

Figure 8:
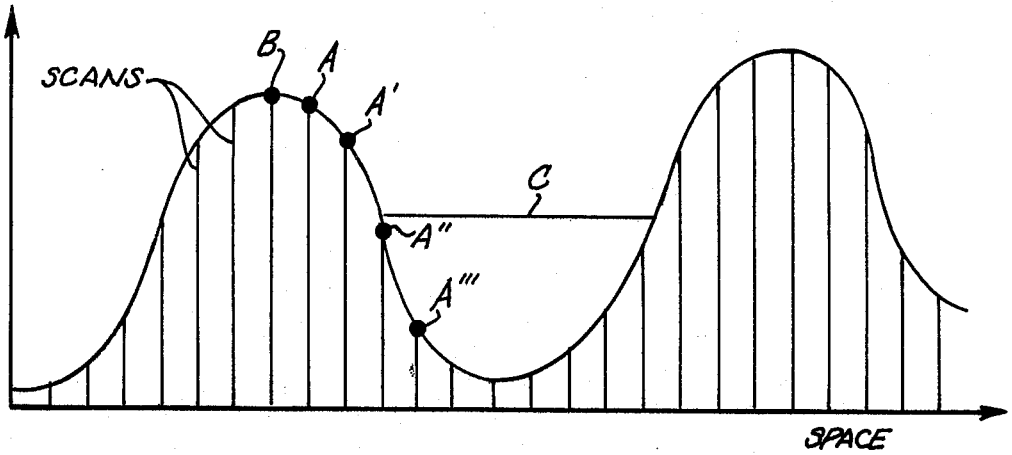
FIG. 8 is a graphical illustration showing the variation in overall signal intensities from one hologram to another.

The graphical illustration of FIG. 7 is representative of a particular scan. However, as seen from a graphical illustration of FIG. 8, several scans are made during the reconstruction of the data block represented by a hologram. As shown in FIG. 8, the overall intensity level of a scan will vary depending on the particular location that a scan is made of a hologram. This also varies the threshold to be employed in making bit decisions. Consequently, it is desirable to have a variable threshold within a given scan and that this threshold be recalculated from scan to scan. This is accomplished in this embodiment of the invention by examining bit positions whose known reconstruction are binary "1" bits. The amplitude of these bit reconstructions is then used to determine the threshold level TL (see FIG. 7) for the information bits in the hologram.

The general slope or curvature for the variable threshold level TL is known. However, because the overall signal level will vary depending on which hologram scan (see FIG. 8) is involved, the value of the slope must be recalculated. As will be brought out in greater detail hereinafter in reference to FIG. 9, the information with respect to the general slope or curvature of the threshold level TL for each bit position may be stored in a programmed read only memory. The first two bits designated in FIG. 7 as threshold bits $T_1$ and $T_2$ are employed to determine the general signal level of the particular scan being considered.

Figure 9:
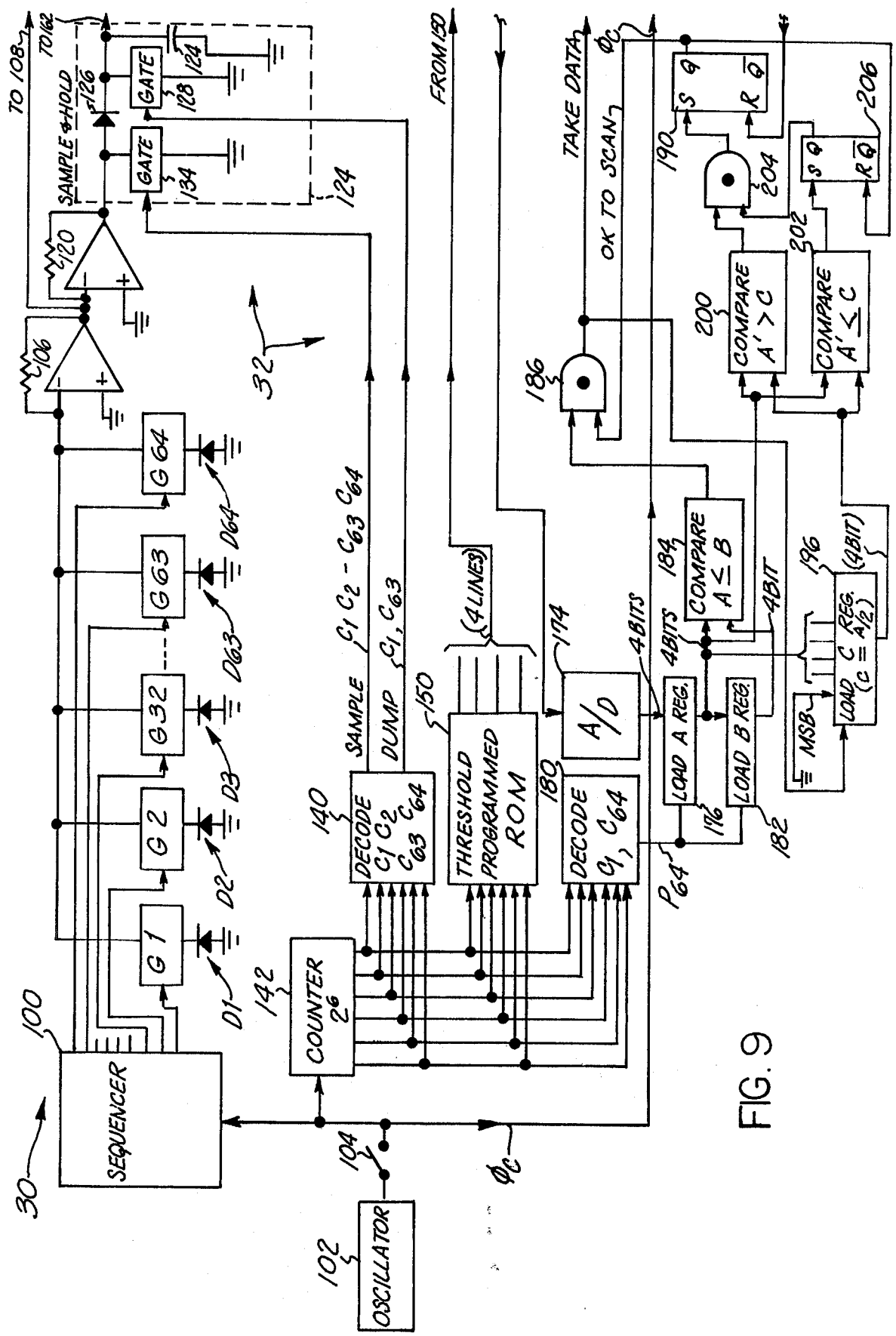
FIGS. 9 9A when placed together show a combined block-schematic diagram of the readout electronics constructed in accordance with the present invention; and, FIG. 10 is a graphical illustration showing various waveforms used in the description of the circuitry in FIG. 9.

Reference is now made to FIG. 9 which illustrates the detector array 30 and the readout electronics 32 in accordance with one embodiment of the present invention. As previously mentioned, the photosensitive array 30 may take the form of a self-scanning type of array which is well known and commercially available. For purposes of simplification, this is illustrated by a sequencer 100 which receives clock pulses from an oscillator 102 upon commencement of operation, as by closure of a switch 104. The sequencer, in turn, serves to sequentially actuate a plurality of gates, each associated with one of the photosensitive detectors. The number of detectors corresponds with the number of bit positions in the hologram being reconstructed. In the example being given, there are 64 bit positions of which 32 may be considered as data bits and several bits on either side thereof being used for various purposes including threshold and synchronizing bits. The first two bit positions are used for threshold bits and the last two positions are used for synchronizing bits.

In the illustration of FIG. 9 only a few of the sixty-four gates are illustrated, including gates G1 and G2 for the threshold bits, a representative data bit position gate G32, and two synchronizing bit gates G63 and G64. The photosensitive detectors are represented in FIG. 9 as photosensitive diodes D1, D2, D32, D63, and D64 each connected in series with its associated gate between ground and the negative input of a driving operational amplifier 106. During a scanning operation, gates G1 through G64 are sequentially actuated so that current will flow through the actuated photosensitive diode with the amplitude of the current corresponding with the intensity level of light received from the hologram for that bit position. The sequencer continues to recycle at a speed at such that a plurality of scans (on the order of 20 scans) are made as each hologram is moved through the readout beam.

In the bit reconstruction process the intensity level for each bit position, as sensed by one of the photosensitive diodes, is amplified by an amplifier 106 and applied to one input of a comparator 108. A variable threshold signal is applied to the other input of the comparator and if the intensity level is greater than that of the threshold level, the comparator provides binary "1" signal representative that the bit position being examined is occupied by a binary "1" signal. Otherwise, the output of comparator 108 remains low, representative of binary "0" signal. All sixty-four bit positions are examined in synchronism with the clock pulses $\phi_c$ obtained from oscillator 102. The bit decision outputs from comparator 108 are converted to a non-return-to-zero format by means of a clocked J-K flip-flop 110 by applying the output of comparator 108 to the J input of the flip-flop. This flip-flop is clocked by the clock pulses $\phi_c$ so that the output pulses from the flip-flop provide a reconstructed bit stream of the data originally recorded. The bit stream includes 64 bit positions and these are shifted into a series input-series output shift register 112 which is also clocked by the clock pulses $\phi_c$. At the end of each scan, the bit decisions for that scan are located in register 112 representative of the binary values of each bit position in the 64 bit data block. If the scan that has just been completed is determined to be the one to be selected as representative of the hologram being read, then the bit decisions will be shifted out through an AND gate 114 and stored in a suitable buffer store 116. However, if this scan was not the one selected, then AND gate 114 will not be enabled and, hence, the bit decisions from the next scan will be shifted into register 112.

VARIABLE THRESHOLD

As discussed previously, the variable threshold level TL (see FIG. 7) to be employed in making bit decisions for each scan is determined by examining threshold bits $t_1$ and $t_2$ which occur at the beginning of the scan. The signal representing these two threshold bits occur in synchronism with the first two clock pulses $c_1$ and $c_2$ (see FIG. 10). These signals are sequentially gated through gates G1 and G2 and are amplified by amplifier 106 and by a second amplifier 120 and supplied to a sample and hold circuit 122. An indication of the signal level intensity for this scan may be obtained by looking at only one of these threshold bits or both or the average of the two or some function thereof. In the example discussed herein, a capacitor 124 in the sample and hold circuit is charged through a diode 126 to the peak value of the two threshold bits. This peak value will be used as the basis for calculating the variable threshold. At the beginning of a scan a value stored in capacitor 124 for the previous scan must be discarded. This is accomplished by applying a dump pulse 130 to a gate 128. When thus actuated, the gate, which may take the form of a transistor switch or the like, provides an effective short circuit across the capacitor so that the capacitor discharges to ground. The dump pulse 130 (see FIG. 10) is a short pulse which occurs in response to the leading edge of clock pulse $c_1$. On the lagging edge of the dump pulse a sample pulse 132 is provided and this is used to actuate a sample gate 134 in the sample and hold circuit. Gate 134 may take the form of a normally closed transistor switch or the like and which, when actuated by sample pulse 132, is opened so that the output from amplifier 120 will be passed through diode 126 to charge capacitor 124 in accordance with the signal level being examined. This gate is opened from the termination of the dump pulse 130 through the remaining portion of clock pulse $c_1$ and through clock pulse $c_2$ so that the capacitor will charge to the peak value of either threshold bit $t_1$ or threshold bit $t_2$.

The dump and sample pulses applied to the sample hold circuit 122 are obtained from a conventional decoder circuit 140 which is connected to the output of a binary counter 142. Counter 142 counts clock pulses $\phi_c$ and has a count capacity of 64 and then recycles. The 6 output circuits of the counter carry a binary signal pattern representative of the count status and this is applied to the decoder 140 which then decodes count pulses $c_1$ and $c_2$ to provide the dump pulse 130 and the sample pulse 132.

As noted from an examination of FIG. 8, the intensity levels will vary from scan to scan and within a scan the intensity levels of binary "1" bit position will vary nonlinearly with distance from the optical axis. The variable threshold TL exhibits a predictable slope or curvature. However, its value must be changed for each bit position for each scan depending upon the value of the threshold bits. The threshold level is effectively produced by storing for each bit position a factor representative of the threshold level for that bit position. These factors are stored in a threshold programmed ROM 150. Since there are 64 bit positions, then 64 factors are stored in the ROM. The ROM is sequentially interrogated in synchronism with the clock pulses $\phi_c$ by the 6 output circuits of the counter 142. As the counter progresses, a binary signal pattern on its four output lines changes representative of the correction factor for each bit position. These four output circuits are connected to gates 152, 154, 156, and 158 associated with a digital to analog circuit 160. This circuit includes a plurality of resistors connected in a series circuit between the output of a high input impedance operational amplifier 162 and the input to the operational amplifier 164. The total series resistance between the output of amplifier 162 and the input of amplifier 164 is considered as resistance $R_1$. The feedback resistance for amplifier 164 is considered as resistance $R_f$. Consequently then, the value of the sample signal is multiplied by a factor of $R_f/R_1$ and the thus modified signal is applied to the positive input of the comparator 108.

The digital to analog circuit 160 is conventional and includes 4 binary weighted resistor networks 166, 168, 170, and 172. Each resistor network includes two resistors connected together in series between the output of amplifier 162 and the input of amplifier 164. Each resistor network is binary weighted relative to the next. If gate 152 be for the least significant bit and gate 158 be for the most significant bit, then network 166 has a total resistance equal 8 times network 172, network 168 is 4 times network 172 and network 170 is twice network 172. Thus, network 166 has the junction of its two series connected resistors connected to gate 152 so that upon receipt of an actuating signal (a binary "1" signal) the gate 152 connects the junction of the two resistors in network 166 to ground. Similarly, the junctions of the resistors in networks 168, 170, and 172 are connected to gates 154, 156, and 158. Thus, a variable threshold signal proportional to the threshold level TL (FIG. 7) is applied to the positive input of the comparator 108 with the value of the threshold level being dependent upon the magnitude of the threshold bits for the scan under consideration as well as the threshold factor for the particular bit position under consideration.

SCAN SELECT

One of the scans of a given hologram will be selected as that to represent data block information stored in that hologram. Selection of a scan is obtained by determining whether the overall intensity level of a scan is near the peak intensity level of the hologram (see FIG. 8). This is accomplished by sampling two bit positions whose known reconstruction represent binary "1" signals. In the example being given, the last two bit positions have this known characteristic and are referred to as synchronization bits $S_1$ and $S_2$. As in the case of the threshold bits $t_1$ and $t_2$, these two bits are supplied to the sample and hold circuit 122 which charges to a level in accordance with the peak value of the two bits. After this information is obtained, it is stored and compared against the synchronization bits of the next scan and this continues until a condition is observed in which the present scan exhibits a signal intensity level which is less than that of the previous scan. In the example of FIG. 8, this is shown as scan A which is the present scan and is slightly less than the last previous scan B. When this condition is noted, the data block for scan A will be selected as that to represent the data stored in the hologram and is outputted to the buffer store 116. The circuitry which accomplishes this is discussed below.

Figure 10:
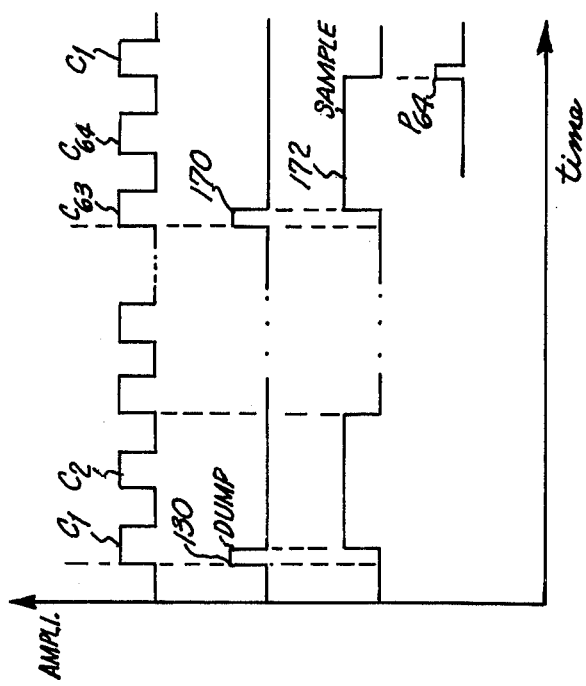
Figure 9A:
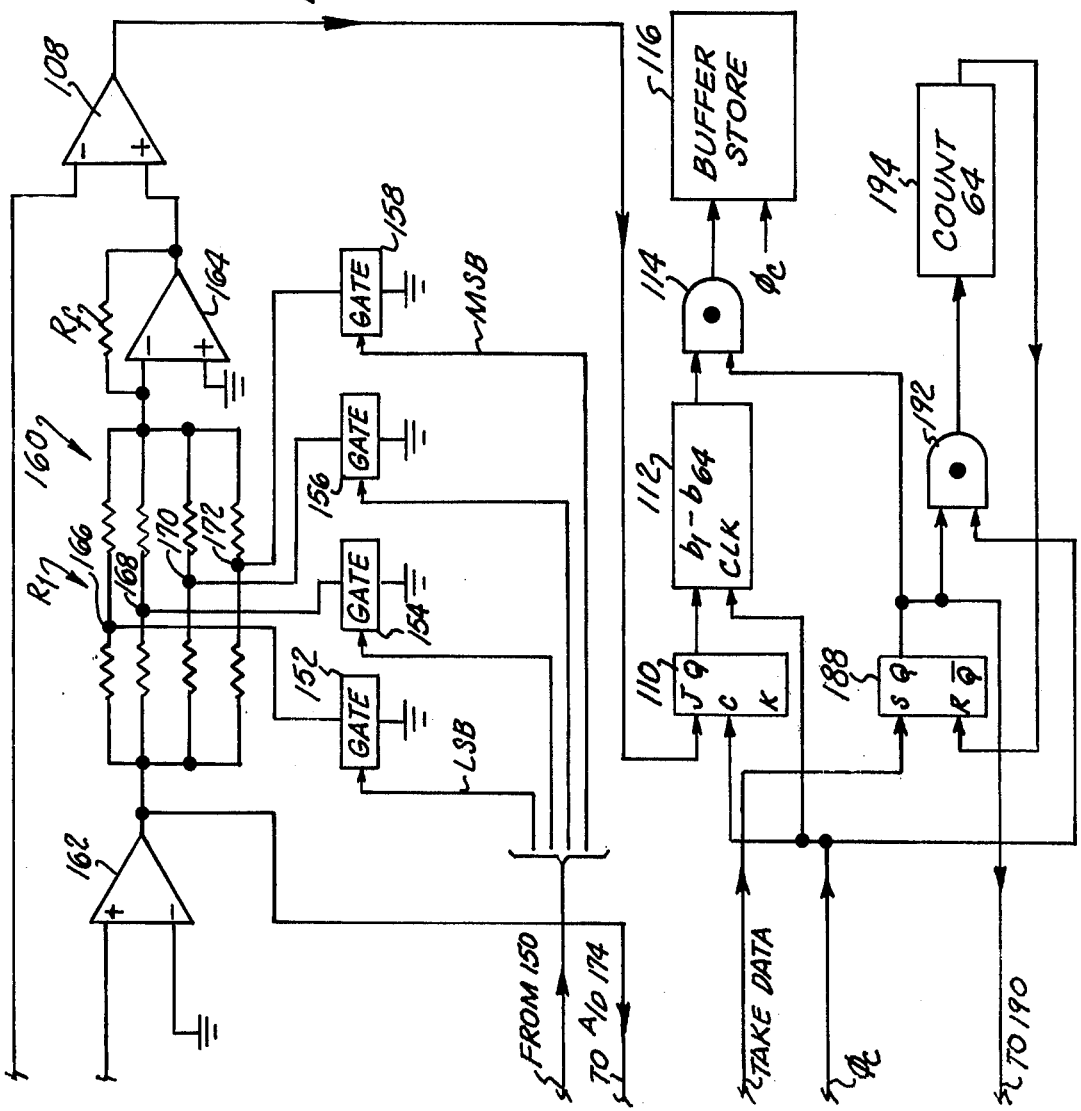

In the example being given, the synchronization bits $S_1$ and $S_2$ (FIG. 7) coincide with clock pulses $c_{63}$ and $c_{64}$ (see FIG. 10). The decoding circuit 140 provides a dump pulse 170 in response to detection of the leading edge of clock pulse $c_{63}$. This dump pulse actuates gate 128 in the sample and hold circuit 122 to effectively provide a short circuit to discharge capacitor 124. Decoder 140 also provides a sample pulse 172 which extends from the trailing edge of dump pulse 170 to the leading edge of the next clock pulse $c_1$. This sample pulse actuates gate 134 to an open condition permitting the synchronization bits $S_1$ and $S_2$ to be passed and charge capacitor 124 to the peak value of the two bit signals. The output of amplifier 162 will be of a signal level representative of the signal energy level of the scan which has just been completed. This signal level is converted by the analog to digital converter 174 to a four bit binary signal pattern representative of the signal level and is loaded into a parallel input-parallel output shift register 176. This is considered as the A register since it stores the information representative of the scan which has just been completed. The information is loaded into the A register 176 when a shift pulse $P_{64}$ is applied to the load input of the register. This shift pulse may be obtained from a decoder 180, similar to decoder 140, which effectively decodes the trailing edge of dump pulse 172 and then produces the shift pulse $P_{64}$ which actuates the A register 176 so as to be loaded with the information of the scan which has just been completed. At the same time, the shift pulse $P_{64}$ is applied to the load input of a B register 182 so that the contents previously stored in the A register 176 are now loaded into the B register 182. The B register is also parallel in-parallel out four bit register. In this way, the information representative of the present scan is located in the A register whereas the information representative of the last previous scan is in the B register 182.

The contents of the A register and B register are compared with a comparator 184 which produces a binary "1" output signal when it notes the contents of the A register are equal to or are less than the contents in the B register. When a scan condition occurs to satisfy this condition, a binary "1" signal is provided by the comparator and passed through an AND gate 186, providing this gate has been enabled to set a flip-flop 188. When flip-flop 188 is actuated to its set condition, its Q output provides a binary "1" signal to enable AND gate 114 permitting the contents of the shift register 112 to be clocked out of the shift register in series fashion through the AND gate for storage in the buffer store 116 in a conventional manner. Also, when flip-flop 188 is actuated to its set condition, it resets a flip-flop 190 causing the Q output terminal of that flip-flop to provide a binary "0" signal to disable AND gate 186. Also, when flip-flop 188 is actuated to its set condition it enables AND gate 192 to pass clock pulses to a counter 194. This counter has the capability of counting 64 clock pulses and then resetting. The counter 194 counts 64 clock pulses which corresponds with the shifting of 64 bits in register 112 to the buffer store 116 and then produces a binary "1" signal to reset flip-flop 188 so as to be conditioned for the next scan selection.

HOLOGRAM SCAN START

Reference is now made to FIG. 8. After a scan select decision has been made based on the comparison of scan A with scan B, the hologram will continue to be moved transversely of the readout beam and additional scans will continue to be made but each is of a lesser signal level than that of scan A and, hence, the results are discarded. The signal levels of the various scans continue to decrease until a second hologram is scanned and then the signal levels will continue to increase until another peak value is detected. This is illustrated in FIG. 8 and it is to be noted that the overall signal levels from hologram to hologram may vary as previously discussed and, hence, the signal levels within the valleys between holograms may vary. When making a decision on a scan select, it is important to note whether the scanning action has moved from one hologram to another. A determination is made as to whether the continuing scans of a hologram as represented by A', A", etc. vary with some level in comparison to scan A. Setting a threshold of C = A/2 provides an indication as to whether or not the additional scans exceed this level or are below this level and, hence, whether the scans are within the valley between two holograms or are out of the valley and within the next hologram. The circuitry to be described below serves to determine whether succeeding scans A', A" etcetera are indicative of the scans within the valley, i.e., less in the threshold level C, or are within the next hologram, i.e., have first been less than the threshold level C and then at a later point have become greater than the threshold level C.

When a scan selection decision was made AND gate 186 provided a binary "1" signal to actuate flip-flop 188. At that time, AND gate 186 also applied a binary "1" signal to the load input of a parallel in-parallel out shift register 196. This register is connected to the output of the A register 176 and the four bit lines from the A register are connected to the input of register 196 so as to effectively input into the register a signal pattern corresponding with the value A/2. This is accomplished by providing a hard-wired shift as indicated in the drawings. Register 196 is referred to as the C register with C = A/2.

The C register 196 has its contents at a level C corresponding to one-half the level of scan A. On each succeeding scan A', A", etcetera, a comparison will be made against this threshold level C. The signals representative of the succeeding scans A', A", are outputted from the A register to comparators 200 and 202. It is to be noted that the contents of the C register remains constant during this period. Comparator 200 provides a binary "1" output signal whenever it notes that a succeeding scan A', A" etcetera exhibits a signal level greater than the threshold level C. In the example of FIG. 8 this condition is met with scan A' at a point in time before the valley is reached. Consequently, results of scan A' will momentarily enable AND gate 204. This will not accomplish anything since the next scan A"
will have a value equal to or less than that of A' and gate
204 will be disabled. When a succeeding scan such as
A" is detected as having a signal level equal to or less
than that of threshold level C, comparator 202 provides
a binary "1" output signal to set a flip-flop 206. This will
enable AND gate 204 to pass the results of comparator
200 the next time that this comparator notes that a succeeding scan has a signal level greater than the threshold level C. When this occurs, flip-flop 190 is actuated
to its set condition and thereby enables AND gate 186
indicating that it is now permissible to select a valid
scan in the readings of the next hologram. One flip-flop
190 has thus been set, it resets flip-flop 206 to return the
circuitry to its condition for again looking for a valley
condition between holograms. The circuitry will now
continue to operate as discussed before, looking for a
scan to be selected to represent the hologram and when
this occurs, comparator 184 will provide a binary "1"
signal which will be passed by AND gate 186 (now
enabled by flip-flop 190) to actuate flip-flop 188 so that
the contents of register 112 may be shifted into the
buffer store 116.

Although the invention has been described with reference to a specific embodiment, it is to be appreciated
that various modifications may be made in accordance
with the invention as defined by appended claims.

What is claimed is:

1. Apparatus for reconstructing a binary bit pattern of a known number of bit positions from a block of analog signals corresponding to the bit positions and varying in signal level with both the binary level represented and a characteristic which causes the signal level of said analog signals to vary in a known manner as a function of bit position and wherein at least one of said analog signals has a known binary level bit reconstruction and comprising:
   means responsive to said at least one analog signal for providing an output signal having a value dependent thereon;
   means for providing a variable threshold signal having a value which varies dependent on said output signal and in said known manner as a function of bit position; and,
   means for sequentially comparing said analog signals with said variable threshold signal and providing a bit decision indication for each of said bit positions dependent upon the respective comparisons for said bit positions.

2. Apparatus as set forth in claim 1, wherein said threshold signal providing means includes interrogatable memory means storing representations of a modifying factor for each said bit position, means for sequentially interrogating said memory means in synchronism with said sequential comparisons to sequentially provide said representations, and means responsive to said output signal and said representations for providing said variable threshold signal having a value which sequentially varies in value with said output signal and said representations as a function of bit position.

3. Apparatus set forth in claim 1, wherein each said analog signal varies in signal level as a function of time and said apparatus includes circuit means for scanning said analog signals a plurality of times, and means for selecting one of said scans to represent the byte of binary data dependent on the scan that exhibits the greatest signal level.

4. Apparatus as set forth in claim 3, wherein said scan select means includes means for registering a first value of a representative analog signal during a first scan and a second value of the representative analog signal during a succeeding second scan and providing a scan select signal when the second value is less than the first value, and means responsive to said scan select signal for registering the bit decision indications for one of said scans.

5. Apparatus for use in reconstructing a byte of binary data from a transform hologram of said byte of binary data wherein said hologram is recorded on light transmissive record means and wherein a readout light beam is transmitted through said record means causing light to be diffracted by the hologram after which an inverse transformation is made on the diffracted light producing the byte of binary data in the form of spatially distributed light beam segments of a variable light intensity pattern, said apparatus comprising:
   a plurality of light sensitive detector means corresponding with the number of bit positions in said byte of data and positioned to respectively receive said beam segments so as to provide a like plurality of analog signals having values respectively dependent on the intensity of light received, at least one of said analog signals having a known binary level bit reconstruction;
   means responsive to said at least one analog signal for providing an output signal having a value dependent thereon;
   means for providing a threshold signal having a value which varies dependent on said output signal and with said bit positions; and,
   bit decision means including means for comparing each of said analog signals with said threshold signal and providing a bit decision indication for each bit position dependent on the comparisons.

6. Apparatus as set forth in claim 5, wherein said light beam segments vary in intensity with both the binary level of the bit position represented as well as with a characteristic that causes said intensity levels to vary in a known manner as a function of bit position, said threshold means providing said threshold signal as a variable signal which varies in signal level as a function of both said output signal and in said known manner as a function of bit position.

7. Apparatus as set forth in claim 5 wherein relative transverse movement is had between said record means and said readout beam so that each said analog signal varies in signal level as a function of the relative transverse displacement of said readout beam and said hologram, said apparatus including circuit means for scanning said plurality of analog signals a plurality of times during said relative movement between said readout beam and said hologram, and means for selecting one of said scans to represent the byte of binary data dependent on the scan which exhibits the greatest signal level.

8. Apparatus as set forth in claim 7, wherein said scan select means includes means for registering a first value of a representative analog signal during a first scan and a second value of the representative analog signal during a succeeding second scan and providing a scan select signal when the second value is less than the first value, and means responsive to said scan select signal for registering the bit decision indications of one of said scans.

9. Apparatus as set forth in claim 8, wherein said light beam segments vary in intensity with both the binary level of the bit position represented as well as with a characteristic that causes said intensity levels to vary in a known manner as a function of bit position, said threshold means providing said threshold signal as a variable signal which varies in signal level as a function of both said output signal and in said known manner as a function of bit position.

10. Apparatus as set forth in claim 8, wherein said record means contains plural holograms and the overall signal levels of the analog signals for each hologram varies with said relative transverse displacement from a low level to a peak level and back toward said low level such that a valley exists between adjacent holograms, said apparatus including circuit means for monitoring said analog signals for each scan and providing an out-of-valley output indication when the signal levels thereof indicate that a just completed scan was taken at a point beyond a valley level between adjacent holograms.

11. Apparatus as set forth in claim 10, wherein said circuit means includes means responsive to said scan select signal for registering a third value as a given function of said second value of said second scan and means for comparing subsequent values of said representative analog signal of subsequent scans with said third value for providing said out-of-valley output indication.

12. Apparatus as set forth in claim 11, wherein said light beam segments vary in intensity with both the binary level of the bit position represented as well as with a characteristic that causes said intensity levels to vary in a known manner as a function of bit position, said threshold means providing said threshold signal as a variable signal which varies in signal level as a function of both said output signal and in said known manner as a function of bit position.

* * * * *